United States Patent
Donde et al.

(10) Patent No.: US 10,503,839 B2
(45) Date of Patent: Dec. 10, 2019

(54) DETECTING STATE ESTIMATION NETWORK MODEL DATA ERRORS

(75) Inventors: Vaibhav D. Donde, Cary, NC (US); Ernst Scholtz, Houston, TX (US); Mats Larsson, Baden-Dättwil (CH); Yan Zhang, Baden (CH); Mani Subramanian, Sugar Land, TX (US); John Finney, Zürich (CH)

(73) Assignee: ABB Schweiz AG, Baden (CH)

( * ) Notice: Subject to any disclaimer, the term of this patent is extended or adjusted under 35 U.S.C. 154(b) by 964 days.

(21) Appl. No.: 13/700,737

(22) PCT Filed: Jun. 11, 2011

(86) PCT No.: PCT/US2011/040112
§ 371 (c)(1),
(2), (4) Date: May 3, 2013

(87) PCT Pub. No.: WO2011/156799
PCT Pub. Date: Dec. 15, 2011

(65) Prior Publication Data
US 2013/0226538 A1   Aug. 29, 2013

Related U.S. Application Data

(60) Provisional application No. 61/354,134, filed on Jun. 11, 2010.

(51) Int. Cl.
G06F 17/10   (2006.01)
G06F 17/50   (2006.01)
H02J 3/00   (2006.01)

(52) U.S. Cl.
CPC ............. *G06F 17/50* (2013.01); *G06F 17/10* (2013.01); *H02J 3/00* (2013.01);
(Continued)

(58) Field of Classification Search
None
See application file for complete search history.

(56) References Cited

U.S. PATENT DOCUMENTS 7,069,159 B2 * 6/2006 Zima ..................... H02H 7/22
702/57
2008/0262758 A1   10/2008 Rehtanz
(Continued)

FOREIGN PATENT DOCUMENTS

| CN | 1427520 | 7/2003 |
|---|---|---|
| CN | 101707373 | 5/2010 |
| EP | 1783499 | 8/2005 |

OTHER PUBLICATIONS

Monticelli Electric Power System State Estimation Proceedings of IEEE, vol. 88, No. 2, Feb. 2000.*
(Continued)

*Primary Examiner* — Kibrom K Gebresilassie
*Assistant Examiner* — Cuong V Luu
(74) *Attorney, Agent, or Firm* — Taft Stettinius & Hollister LLP; J. Bruce Schelkopf

(57) ABSTRACT

Methods for detecting network model data errors are disclosed. In some examples, methods for detecting network model data errors may include splitting a network model into a first plurality of portions, executing an algorithm on each of the portions, identifying a portion for which the algorithm is determined to be non-converged, splitting the identified portion into a second plurality of portions, repeating the executing, identifying and splitting the identified portion until a resulting identified portion is smaller than a predefined threshold, and examining the resulting identified portion to identify plausible data errors therein. In some examples, examining the resulting identified portion to identify plausible data errors therein may include executing
(Continued)

a modified algorithm, which may include an augmented measurement set, on the identified portion.

19 Claims, 11 Drawing Sheets

(52) U.S. Cl.
CPC ......... *H02J 2003/007* (2013.01); *Y02E 60/76* (2013.01); *Y04S 40/22* (2013.01)

(56) References Cited

U.S. PATENT DOCUMENTS

| | | | |
|---|---|---|---|
| 2009/0112375 A1* | 4/2009 | Popescu | H02H 7/261 700/292 |
| 2009/0125158 A1 | 5/2009 | Schweitzer | |
| 2011/0004425 A1 | 1/2011 | Schweitzer | |

OTHER PUBLICATIONS

Ejima et al. New Bad Data Rejection Algorithm using Nonquadratic Objective Function for State Estimation IEEE 2007.*
Vuong et al. Detection and Identification of Topological Errors From Real-Time Measurements Reconciliation IEEE 2002, pp. 228-233.*
Handschin et al. Bad Data Analysis for Power System State Estimation IEEE Transactions on Power Apparatus and Systems, vol. PAS-94, No. 2 Mar./Apr. 1975, pp. 329-337.*
Robert Amerongen on Convergence Analysis and Convergence Enhancement of Power System Least-Square State Estimators IEEE Transactions on Power System, vol. 10, No. 4, Nov. 1995.*
Mili et al.Robust Estimation Method for Topology Error IdentificationIEEE Transactions on Power System, vol. 14, No. 4 Nov. 1999, pp. 1469-1476.*
Salama et al. A Unified Decomposition Approach for Faulty Location in Large Analog CircuitsIEEE Transactions on Circuits and System, vol. CAS-31, No. 7, Jul. 1984.*
Alpert et al. Recent Directions in Netlist Partitioning: a Survey, IntegrationVLSI Journal 19, 1995.*
Clements et al. Topology Errors Identification Using Normalized Lagrange Multipliers IEEE Transactions on Power Systems, vol. 13, No. 2, May 1998.*
European Patent Office, Communication pursuant to Rules 161 (1) and 162 EPC in corresponding European Application No. 11726305. 3, dated Apr. 2, 2013.
F. Postiglione, Reply to Apr. 2, 2013 Communication pursuant to Rules 161 (1) and 162 EPC in corresponding European Application No. 11726305.3, dated Sep. 27, 2013.
The Patent Office of the People's Republic of China, Office Action for corresponding Chinese patent application No. 201180035954.0, dated Feb. 28, 2015.
Steven Hudnut, Instructions and Claims for Response to Office Action dated Feb. 28, 2015 for corresponding Chinese patent application No. 201180035954.0, dated Sep. 7, 2015.
Doreen Golze, International Searching Authority (EPO), Invitation to Pay Additional Fees and, Where Applicable, Protest Fee for corresponding International Application No. PCT/US2011/40112, European Patent Office, dated Oct. 17, 2012.

Aly E. Salama, Janusz. A. Starzyk and John W. Bandler, "A Unified Decomposition Approach for Fault Location in Large Analog Circuits," IEEE Transactions on Circuits and Systems, vol. CAS-31, No. 7, pp. 609-622, Jul. 1984.
Alberto Sangiovanni-Vincentelli and Leon O. Chua, "An Efficient Heuristic Cluster Algorithm for Tearing Large-Scale Networks," IEEE Transactions on Circuits and Systems, vol. CAS-24, No. 12, pp. 709-717, Dec. 1977.
Nisheeth Singh and Hans Glavitsch, "Detection and Identification of Topological Errors in Online Power System Analysis," IEEE Transactions on Power Systems, vol. 6, No. 1, pp. 324-331, Feb. 1991.
Ali Abur and Antonio G. Exposito, "Power System State Estimation: Theory and Implementation," pp. viii-xiii, 1-35, 195-242, Marcel Dekker, New York, 2004.
A. Monticelli, "State Estimation in Power Systems: a Generalized Approach," pp. 1-13, 202-225, Kluwer Academic Publishers, Boston, 1999.
Ali Abur, "A Bad Data Identification Method for Linear Programming State Estimation," IEEE Transactions on Power Systems, vol. 5, No. 3, pp. 894-901, Aug. 1990.
K.A. Clements and P.W. Davis, "Detection and Identification of Topology Errors in Electric Power Systems," IEEE Transactions on Power Systems, vol. 3, No. 4, pp. 1748-1753, Nov. 1988.
Felix F. Wu and Wen-Hsiung E. Liu, "Detection of Topology Errors by State Estimation," IEEE Transactions on Power Systems, vol. 4, No. 1, pp. 176-183, Feb. 1989.
P. Bonanomi and G. Gramberg, "Power System Data Validation and State Calculation by Network Search Techniques," IEEE Transactions on Power Apparatus and Systems, vol. PAS-102, No. 1, Jan. 1983.
A. Simões Costa and J. A. Leão, "Identification of Topology Errors in Power System State Estimation," IEEE Transactions on Power Systems, vol. 8, No. 4, pp. 1531-1538, Nov. 1993.
Ali Abur, Hongrae Kim, and Mehmet Celik, "Identifying the Unknown Circuit Breaker Statuses in Power Networks," IEEE Transactions on Power Systems, vol. 10, No. 4, pp. 2029-2037, Nov. 1995.
João Hespanha, "An Efficient MATLAB Algorithm for Graph Partitioning," Technical Report, University of California, Oct. 2004.
Antonio Simões Costa, Robert Salgado and Paulo Haas, "Globally Convergent State Estimation Based on Givens Rotations," Bulk Power System Dynamics and Control VII, iREP Symposium, 2007.
Doreen Golze, International Searching Authority (EPO), International Search Report and Written Opinion of the International Searching Authority for corresponding International Application No. PCT/US2011/040112, European Patent Office, dated Feb. 1, 2013.
The Patent Office People's Republic of China, Office Action for corresponding Chinese patent application No. 201180035954.0, dated Dec. 28, 2015, english translation, 17 pgs.
The Patent Office People's Republic of China, Office Action for corresponding Chinese patent application No. 201180035954.0, dated Dec. 28, 2015, english translation, 16 pgs.
The Patent Office People's Republic of China, Office Action for corresponding Chinese patent application No. 201180035954.0, dated Dec. 28, 2015, english translation, 21 pgs.
Examination Report for Indian Patent Application No. 3846/KOLNP/2012, dated Dec. 12, 2018, 7 pages.

* cited by examiner

```
read_system_data(S0)
Call static_error_search (S0)

function static_error_search (S)
    execute_SE(S)
    if non-convergence
        then (S1...Sn) = split (S,n)
        for each sk in (S1...Sn)
            if size(sk)>N
                call static_error_search (sk)
            else
                /* error found in (sk) */
                print_results(sk)
        end
    end
```

■ MISPLACED P, Q FLOW MEASUREMENTS

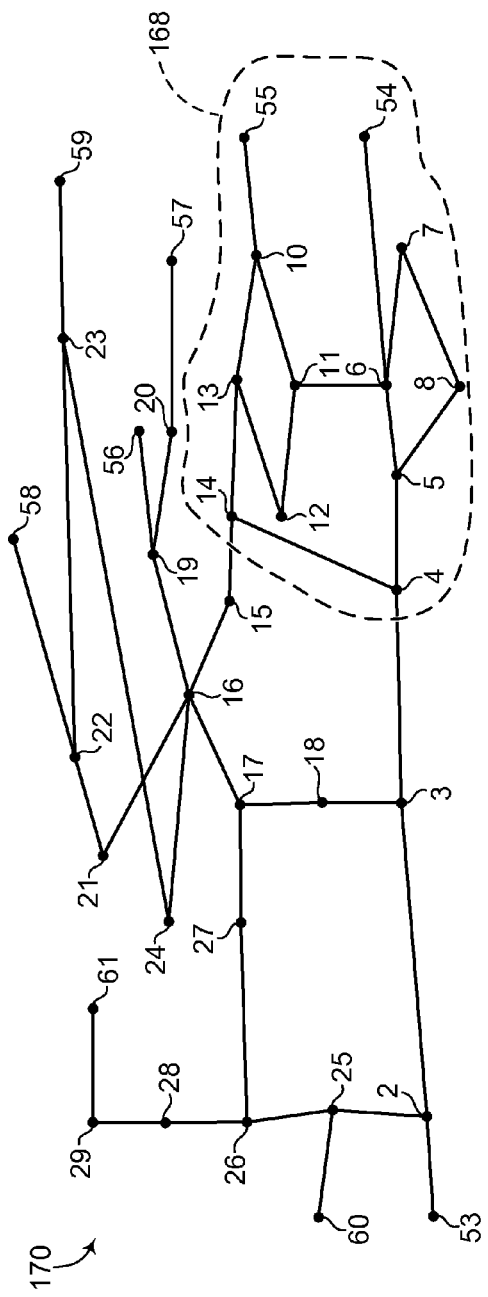
Fig. 10
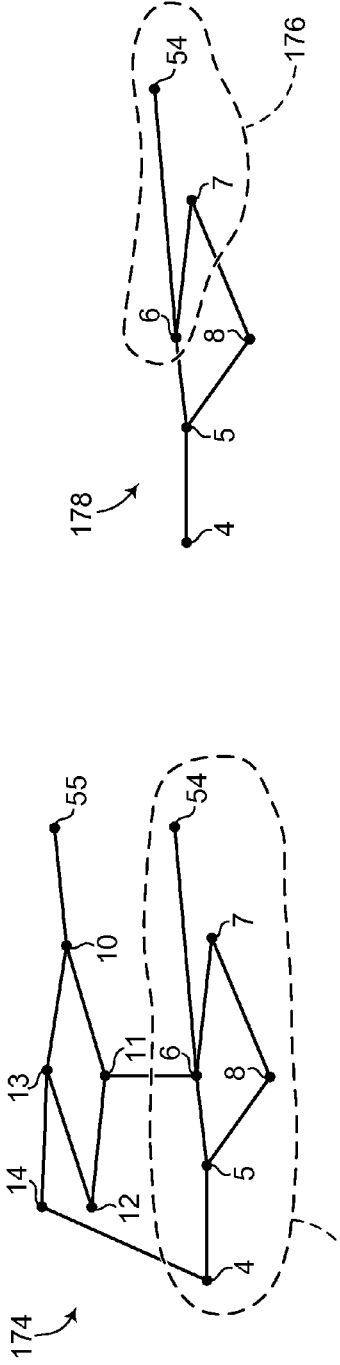
Fig. 11
Fig. 12

```
Non-convergence: suspected buses
---------------------------------------------          ---------------------------------------------
First Iteration                                        Third Iteration
---------------------------------------------          ---------------------------------------------
1    2    3    4    5    6    7                        4    5    6    7    8    10   11   12
8    9    10   11   12   13   14                       13   14   54   55
15   16   17   18   19   20   21                       ---------------------------------------------
22   23   24   25   26   27   28                       Fourth Iteration
29   30   31   32   33   34   35                       ---------------------------------------------
36   37   38   39   40   41   42                       4    5    6    7    8    54
43   44   45   46   47   48   49                       ---------------------------------------------
50   51   52   53   54   55   56                       Fifth Iteration
57   58   59   60   61   62   63                       ---------------------------------------------
64   65   66   67   68                                 6    7    54
---------------------------------------------          ---------------------------------------------
Second Iteration
---------------------------------------------
2    3    4    5    6    7    8
10   11   12   13   14   15   16
17   18   19   20   21   22   23
24   25   26   27   28   29   53
54   55   56   57   58   59   60
61
---------------------------------------------
```

Fig. 13

DETECTING STATE ESTIMATION NETWORK MODEL DATA ERRORS

CROSS REFERENCE TO RELATED APPLICATION(S)

This application claims the benefit of and priority to U.S. Provisional Patent Application Ser. No. 61/354,134, which was filed on Jun. 11, 2010 and is entitled "Methods for Detecting Power System State Estimation Errors." The complete disclosure of the above-identified patent application is hereby incorporated by reference for all purposes.

FIELD OF THE DISCLOSURE

The present disclosure relates to state estimation network models, and more particularly to detecting state estimation network model data errors.

BACKGROUND

Electric power systems may include power transmission and distribution networks and substations for transforming voltages and for switching connections between lines of the networks. Power generation and load flow within a power system may be monitored and/or managed by a Supervisory Control and Data Acquisition System (SCADA) and/or an Energy Management System (EMS).

State estimation may be used to provide real-time power flow status and modeling representations of a system, such as an electric power system or other system or network that has the characteristics of an electric power system, such as for use in or with an EMS, a Distribution Management System (DMS), or the like. State estimation provides the system operator with a system state for situational awareness and input to other applications, such as contingency analysis or voltage stability analysis. When used with an EMS, state estimators provide a state estimation for an electric power system based on a model of the power system and measurements from the field.

State estimators provide a state estimation based on static and dynamic data regarding the system. Static data may include a nominal topological model or a topology of the network, the types and placements of measurements, and the sign of the measured values. Dynamic data may include measurement values, open/closed statuses of circuit breakers (or other types of switches in the field) and indication signals.

The network topology may include the way transmission lines are connected to form the network, as well as the open/closed statuses of switches in transmission system substations. The way transmission lines are connected to form the network may define a static topology because the transmission line connections remain unchanged during the system operation. The circuit breaker and switch statuses in transmission system substations may define a dynamic topology because the breaker and switch statuses can change on the fly during the system operation.

Mistakes or errors in either the static or dynamic data may result in bias in the estimated system state, produce an incorrect solution, or result in non-convergence of the estimated state. For example, an incorrectly assumed topology in the model can have an adverse effect on the state estimation solution quality because the network connectivity or topology of the power system plays a role in defining the system model. Thus, any errors in the static or dynamic topology description, as assumed in the EMS database, may result in topology errors.

Errors in the dynamic data may include errors in analog measurements and errors in the dynamic topology due to incorrectly assumed open/closed statuses of circuit breakers and/or switches. Errors in the static data may include incorrect parameters or data, as well as an incorrect static topology. Incorrect static topology may include erroneous assumptions with respect to transmission line connections, the types or placements of measurements, or the signs of the measured values.

Examples of state estimation are disclosed in EP1783499 and U.S. Pat. No. 7,069,159. Further details regarding power system state estimation are explained in the textbooks entitled "Power System State Estimation: Theory and Implementation," by A. Abur and A. G. Expósito (Marcel Dekker, New York, 2004) and "State Estimation in Electric Power Systems: A Generalized Approach," by A. Monticelli (Kluwer Academic Publishers, Boston, 1999). The disclosures of these and all other publications referenced herein are incorporated by reference in their entirety for all purposes.

SUMMARY

In some examples, methods for detecting network model data errors may include splitting a network model into a first plurality of portions, executing an algorithm on each of the portions, identifying a portion for which the algorithm is determined to be non-converged, splitting the identified portion into a second plurality of portions, repeating the executing, identifying and splitting the identified portion until a resulting identified portion is smaller than a predefined threshold, and examining the resulting identified portion to identify plausible data errors therein.

In some examples, methods for detecting state estimation network model static data errors may include locating a portion of a network model for which a state estimation algorithm does not converge, and executing a modified state estimation algorithm on the portion to identify plausible static data errors therein. The modified state estimation algorithm may include an augmented measurement set.

In some examples, methods for detecting static data errors in a power system state estimation network model may include splitting the network model into a first plurality of partitions, executing a state estimation algorithm on each of the of partitions, identifying a partition for which the state estimation algorithm does not converge, splitting the identified partition into a second plurality of partitions, repeating the executing, identifying and splitting the identified partition until a resulting identified partition is smaller than a predefined number of nodes, and examining the resulting identified partition to identify plausible static data errors therein.

BRIEF DESCRIPTION OF DRAWINGS

FIGS. 9-12 illustrate an implementation of a nonexclusive illustrative example of a recursive network splitting method.

FIG. 13 is a tabulation of the results of the iterations of the example illustrated in FIGS. 9-12.

DETAILED DESCRIPTION

As will be more fully explained below, the disclosed methods include two parts. In the first part, a recursive combined bad data and topology detection is performed by successively partitioning or splitting the network model into multiple loosely connected partitions or portions and executing an algorithm, such as a state estimation algorithm, on each of the partitions or portions to check its convergence. The meaning of convergence, and conversely non-convergence, as used herein, will be more fully set out below. The process is continued until it identifies areas or portions of the network model that cause state estimation non-convergence, which may be due to those portions including bad data, such as bad parameters, bad measurement data, and/or bad static/dynamic topology. Thus, the first part identifies potentially problematic portions of the network model. In the second part, the portions identified in the first part are inspected or examined in more detail to identify plausible explanations of the problems in those portions, such as plausible static data errors within the identified portions.

The successive partitioning or splitting performed in the first part may make the detailed inspection done in the second part more computationally feasible. For example, since the first part removes from consideration non-problematic (i.e., converging) parts of the network model, the second part need only examine the identified portions of the network model, which may have much smaller size(s) than the entire system network model.

As may be understood, the identification process is not affected by divergence/non-converge problems, which is of great value in a real time environment. Furthermore, rather than being impeded or prevented by divergence/non-convergence problems, the first part of the disclosed methods use the divergence/non-convergence of the network model, and its various portions, as a way to identify the problematic portions. Accordingly, the methods may be useful, for example, during commissioning of a new state-estimator, where modeling errors may be severe enough that the state-estimator does not converge. In particular, unlike the various post-processing methods of state estimation error detection, such as residual analysis, which may require that the state estimation converge in order to detect the errors, the disclosed methods detect model and topology errors even when the state-estimator does not converge.

Figure 1:
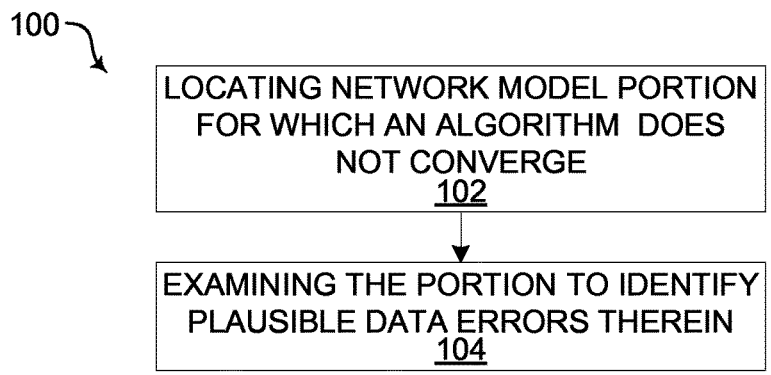
FIG. 1 is a flow chart showing a nonexclusive illustrative example of a method for detecting network model data errors, such as state estimation network model errors.
Figure 2:
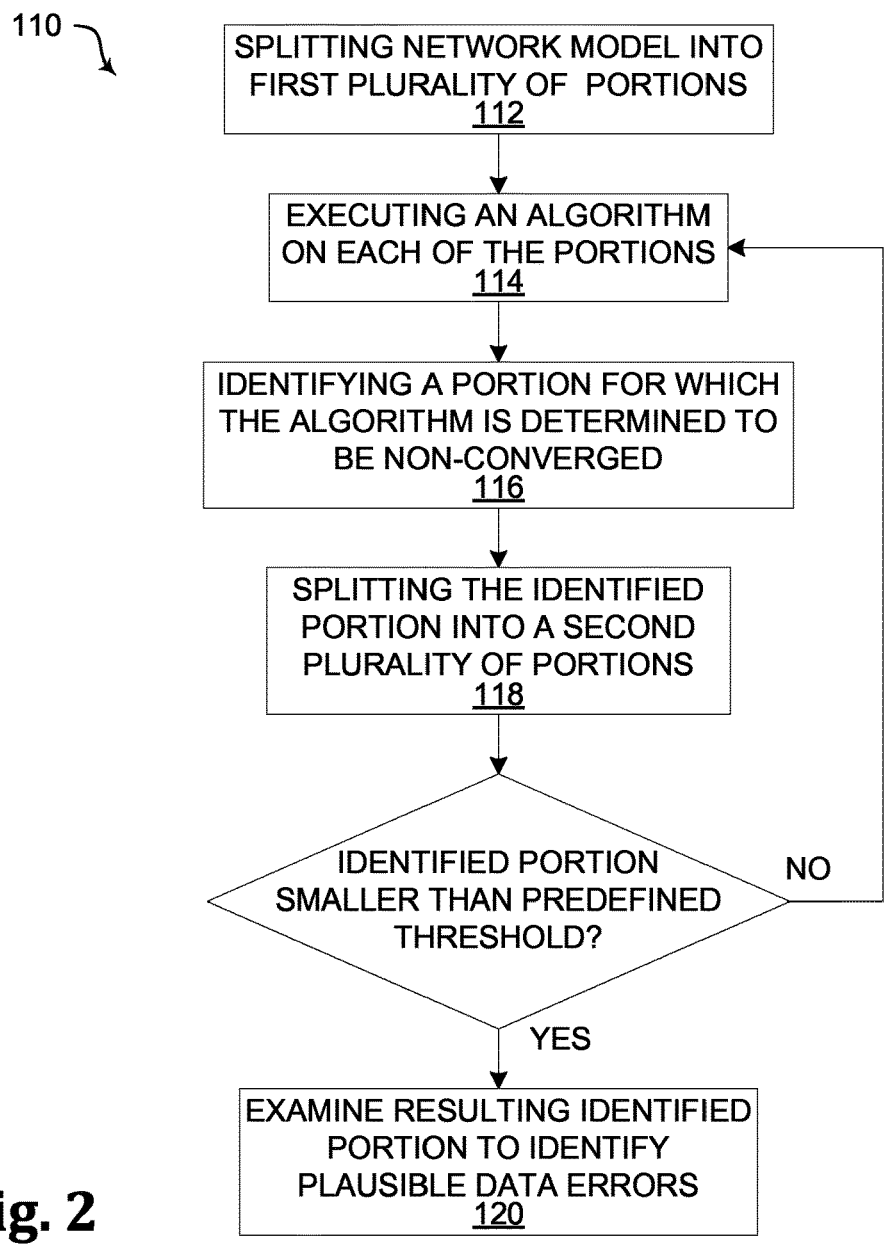
FIG. 2 is a flow chart showing a nonexclusive illustrative example of a method for locating a portion of a network model for which an algorithm does not converge.

A nonexclusive illustrative example of a process or method for detecting network model data errors is schematically illustrated in a flow chart at 100 in FIG. 1. Although the actions of the method may be performed in the order in which they are presented below, it is within the scope of this disclosure for the following actions, either alone or in various combinations, to be performed before and/or after any of the other following actions. The illustrated method 100 includes a first part 102 comprising locating a portion or portions of a network model for which an algorithm, such as a state estimation algorithm, does not converge and a second part 104 comprising examining the located portion or portions to identify plausible data errors therein.

In some examples, the disclosed methods may be used for detecting errors in the measurements and network models used for power system state estimation, such as for use in an EMS or a DMS. By way of example, the method 100 may be used to detect at least static data errors, such as incorrect static topology assumptions or static topology errors in network models used for power system state estimation.

As will be more fully set out below, the first part 102 may use the convergence or non-convergence of a state estimation to locate or identify errors in the inputs of a state estimator, such as wrongly connected or defined measurements or incorrect static topology. In particular, the first part 102 may locate or identify the portions or sub-areas of the network model that cause non-convergence of the state estimation by way of a recursive procedure that splits the network model into two or more sub-areas upon which a state estimation is individually executed. As may be understood, the state estimations for the successively identified sub-areas of the network model that contain modeling or other errors will continue being non-convergent, while the sub-areas with no modeling errors will start to converge. The sub-areas of the network model that converge may be discarded, while the sub-areas that are still non-convergent may again be analyzed using the same procedure. Thus, execution of the first part 102 can localize configuration or other errors to within a few nodes, which may correspond to substations or buses, in the network model, at which point the second part 104 or a manual check may be used to identify the particular errors.

A nonexclusive illustrative example of a process or method for locating a portion of a network model for which an algorithm does not converge, such as to implement the first part 102 of the method 100, is schematically illustrated in a flow chart at 110 in FIG. 1. Although the actions of the method may be performed in the order in which they are presented below, it is within the scope of this disclosure for the following actions, either alone or in various combinations, to be performed before and/or after any of the other following actions. The illustrated method 110 includes splitting a network model into a first plurality of partitions or portions, as indicated at block 112, executing an algorithm on each of the portions, as indicated at block 114, identifying a portion for which the algorithm is determined to be non-converged, as indicated at block 116, and splitting the identified portion into a second plurality of portions, as indicated at block 118. In some examples, the algorithm executed on the portions may be a state estimation algorithm. The executing, identifying and splitting the identified portion may be repeated until the resulting identified portion is smaller than a predefined threshold. Once a resulting identified portion is smaller than a predefined threshold, the resulting identified portion may be examined to identify plausible data errors therein, as indicated at 120.

A network model may be partitioned or split using any suitable method, such as one based on mathematical graph theory. In some examples, the splitting method may partition or split the network model in a way that minimizes the number of connections between the different areas, such that the resulting portions may be loosely connected systems. In some examples, the splitting method may partition or split the network model in a way that minimizes or avoids cutting on the branches where there are no flow measurements.

In the examples disclosed herein, the network model is split into a plurality of portions using the "spectral factorization" method set out in the technical report entitled "An efficient MATLAB Algorithm for Graph Partitioning," by Joao Hespanha (University of California, Oct. 2004, available at ece.ucsb.eduhhespanha/published/tr-ell-qp.pdf), the complete disclosure or which is incorporated by reference for all purposes. Each of the successive partitionings or splittings of the network model may be bi-way or k-way, with the disclosed examples utilizing bi-partitioning of the network.

Under the utilized "spectral factorization" method, the graph partitioning problem seeks to find a k-partition p that minimizes the cost associated with p, c(p), with no element in a partition having more than L vertices, where L=N/k, N is the number of vertices of the graph, and k is the number of partitions. For an undirected graph G=(V, E), with vertex set V and edge set E, a k-partition of V is a collection p={V1, V2, ..., Vk} of k disjoint subsets of V. The cost associated with p, c(p), is defined as:

$$c(p) = \Sigma\Sigma c(v, \bar{v}) \quad (1)$$

The costs associated with each node are "normalized" so that when the degree of a node is high, then the costs associated with its edges will be low (on the average):

$$\sum_{v \in V} c(v, \bar{v}) = 1 \quad (2)$$

The utilized "spectral factorization" method is based on spectral factorization plus K-means clustering, which computes the graph adjacency matrix, normalized as equation (2), then computes the first k eigenvector $U=[u1, u2, ..., uk]$, letting yi (i=1, 2, ..., n) be the buses corresponding to the i-th row of U, and clusters the buses with a k-means algorithm into clusters c1, ..., ck. The k-partition network p includes the buses in those clusters as:

Partitioned network $p1, p2, ..., pk$, with
$$p_i = \{j | y_j = C_i\} \quad (3)$$

Figures 3, 4:
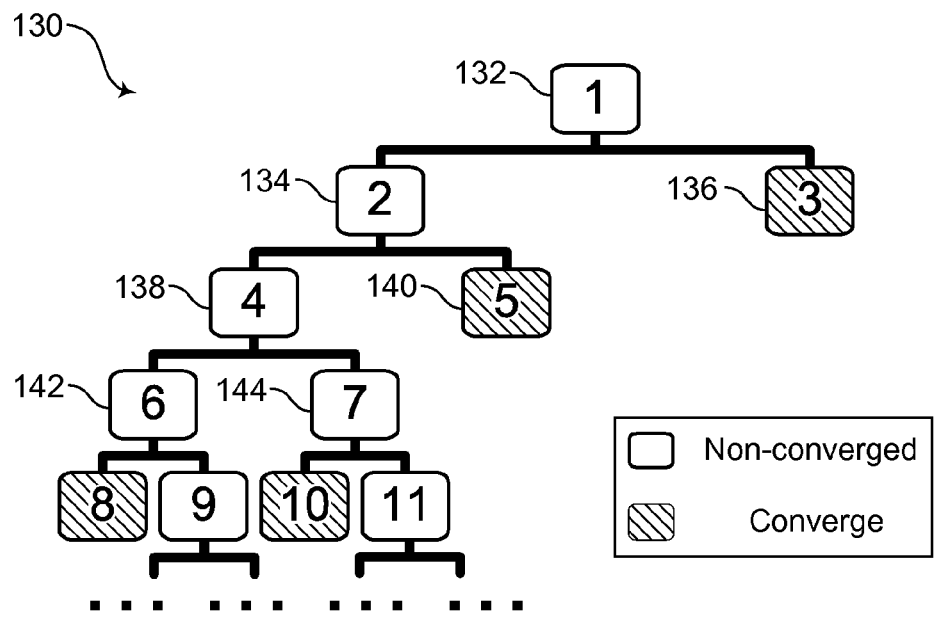
FIG. 3 schematically illustrates a nonexclusive illustrative example of an implementation of a recursive network splitting method, such as the method illustrated in FIG. 2.
FIG. 4 is a pseudocode for a recursive network splitting method, such as the method illustrated in FIG. 2.

A nonexclusive illustrative example of a recursive network splitting implementation, such as by way of the method 110, is schematically illustrated in FIG. 3. As shown, the recursive network splitting method starts at the top of the tree 130 from a case where non-convergence has been detected during execution of a state estimation for the whole network model, as indicated at 132. The network model is then split into second and third areas and, which are indicated at 134 and 136, and a new state estimation is executed for each of the second and third areas. In the illustrated example, the state estimation for the third area 136 converges, and that portion of the network model may be discarded. However, the state estimation for the second area 134 still does not converge, and the procedure is repeated, with the second area 134 being split into fourth and fifth areas, which are indicated at 138 and 140, a new state estimation is executed for each of the fourth and fifth areas. In examples where there are errors sufficient to cause a non-convergence in the state estimation for both, or all, of the areas resulting from a particular splitting, as with the fourth area 138 in FIG. 3, the splitting procedure may be continued for both of the resulting sixth and seventh areas, which are indicated at 142 and 144.

The network splitting method may be continued until each of the remaining areas for which the state estimation is non-convergent is smaller than a predefined number of nodes, with the nodes corresponding to substations or busbars in the physical power system. The actual cause of the non-convergence in one of the resulting areas can be studied in more detail after it is located in a relatively small portion of the network model, either manually or using an automatic procedure as will be explained more fully below with regard to the second part 104 of the method 100.

A pseudo-code of the a recursive network splitting method, such as one the implements the method 110, is set out in FIG. 4. The recursive procedure static_error_search executes the error search for an area (S0), which may be read in before the first call of the procedure. The function execute_SE(S) calls the SE (state estimation) solution engine, and the function split splits the network description into n subareas. Finally, print_results(sk) outputs the results, such as in the form of node numbers or branch numbers in the area for which the state estimation solution is non-convergent. The splitting of the network is stopped when each area is smaller than a predefined threshold, such as where each area contains fewer than a certain predefined number (N) of nodes or branches.

A standard iterative weighted-least squares (WLS) method may be used for a state estimation, or as a part of a state estimation algorithm, as set out in the Abur and Monticelli texts identified above. The WLS state estimator equations relating the measurements and the state vector are $$z = h(x) + w \quad (4)$$

where z is the (m×1) measurement vector, h(x) is the (m×1) non-linear function vector, x is the system state vector, and w is the measurement error vector. The measurements may include power flow, power injection, reactive and real power, and also bus voltage magnitude. The WLS state estimation problem may be solved by an iterative scheme:

$$G(x^k)\Delta x_k = H^T(x_k)R^{-1}\Delta z_k \quad (5)$$

where $$\Delta x_k = \Delta x_{k+1} - x_k \; \Delta z_k = z - h(x_k) \quad (6)$$

$$G(x_k) = H^T(x_k)R^{-1}H(x_k) \quad (7)$$

where R is the measurement covariance matrix, G is the gain matrix and $$H = \frac{\partial h(x)}{\partial x} \quad (8)$$

is the Jacobian matrix of h(x).

The state estimation may require a minimum set of measurements to estimate the system state (voltage and angle on each bus) successfully. The minimal measurements number may be equal to (2N−1), which is the number of state variables, where N is the number of buses in the system network. The critical number of real and reactive measurement pairs may be (N−1), with one additional voltage magnitude measurement.

It may be assumed, that if enough measurements are not available to make the network observable, pseudo measurements, which may be based on schedules, may be added such that the network becomes observable. The methods will then also be able to detect problems related to errors in those schedules.

In some examples, the iterations may be stopped whenever the absolute incremental changes are less than 0.001 per unit (p.u.) for all state variables, or when number of iterations exceeds 20. When the mismatch of power injection on each bus is less than 0.01 p.u., the methods may conclude or determine that the state estimation has converged; otherwise, the state estimation may be identified as non-converged. In some examples, convergence of the state estimation may be defined as non-divergence of the state estimation, with the additional requirement that bus mismatches in terms of MW and MVar injection are smaller than predefined threshold values, where the mismatch of injection refers to the difference between Pi−(Pgi−PLi), where Pi is the estimated active power injection at bus i, and Pgi is the generation at bus i, and PLi is the load at bus i.

Figure 5:
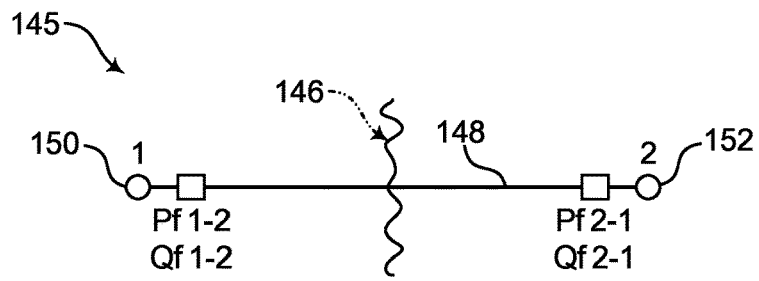
FIG. 5 illustrates a measurement conversion on boundary buses during partitioning of a network model.
Figure 6:
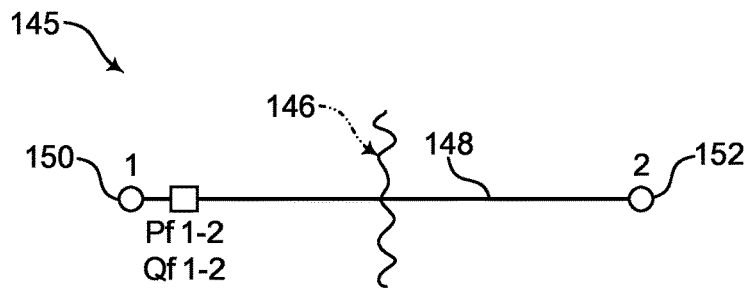
FIG. 6 illustrates another measurement conversion on boundary buses during partitioning of a network model.

During partitioning of a network model, considerations may be made for the measurements on the boundary buses to avoid disrupting the state estimation. Injection measurements, being only bus-related, may be left unchanged. However, flow measurements may have to be converted into injection measurement to its related bus. Examples of these considerations are illustrated in FIGS. 5 and 6, where it is assumed that a network 145 is cut, as indicated at 146, on the branch 1-2, which is the branch 148 extending between the nodes 150 and 152. If there are flow measurements at both ends of the line, as shown in FIG. 5, the flow measurements may be converted into injection measurements of its connected bus as:

$$P_{i1} = -P_{f1-2} \; Q_{i1} = -Q_{f1-2}$$

$$P_{i2} = -P_{f2-1} \; Q_{i2} = -Q_{f2-1}$$

If there is only one flow measurement on the line, at the end of the bus 1 corresponding to the node 150, as shown in FIG. 6, the flow measurements may be converted into injection measurements as:

$$P_{i1} = -P_{f1-2} \; Q_{i1} = -Q_{f1-2}$$

$$P_{i2} = -P_{f1-2} \; Q_{i2} = Q_{f1-2}$$

The converted measurements then may be combined with the generations and loads on the bus (if there are generations and loads), to be used as injection measurements by the state estimation or to be used to calculate the mismatch of power at each bus.

An implementation of a recursive network splitting method, such as the method 110, is generally illustrated in FIGS. 5-11. In the illustrated example, the method has been applied to the 68-bus network model 160 shown in FIG. 7. The network model 160 has 68 nodes, which may correspond to buses, and 82 branches, which may include lines and transformers. The nodes are shown as dots, and identified with reference numbers 1 through 68. The branches are shown as solid lines extending between the dots corresponding to the buses or nodes. The illustrated network model includes 164 pairs of active power (P) and reactive power (Q) measurements (the squares on the branches), 68 voltage measurements (V), which are the small squares connected to each of the dots corresponding to the buses or nodes, and no injections measurements. Although the system corresponding to the network model 160 includes all possible branch flow measurements (at both ends of each branch), the disclosed methods could be executed on a system having fewer measurements, so long as there are sufficient measurements to permit solution of the state estimation problem.

Figure 8:
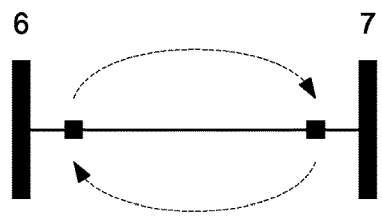
FIG. 8 illustrates a nonexclusive illustrative example of an error on the branch between buses 6 and 7 that may be included in the network model of FIG. 7 for use with the example illustrated in FIGS. 9-12.
Figure 7:
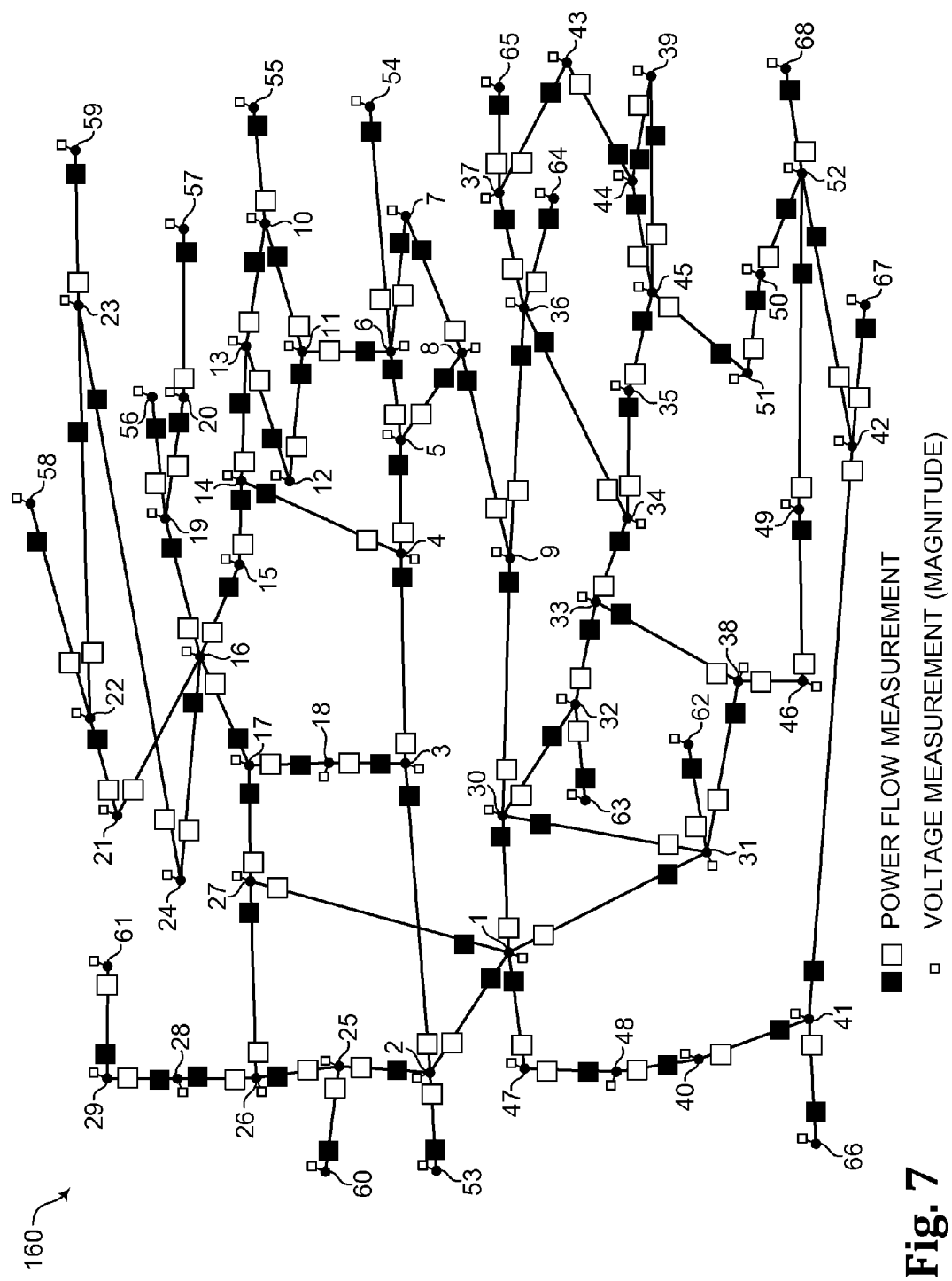
FIG. 7 is a single line diagram for an example network model upon which the disclosed methods may be executed, showing the locations of loads, generation and allocated measurements.

As an example of the method 110, an error may be introduced in the network model 160 in the form of misplaced measurement on the branch between nodes 6 and 7 (branch 6-7) as follows. As shown in FIG. 8, the example error includes the flow measurements at the end of node 6, which corresponds to bus 6, being actually generated from the flow at the end of node 7, which corresponds to bus 7, and vice versa. This leads to bus power mismatches at buses 6 and 7, which would cause non-convergence of a state estimator.

Figure 9:
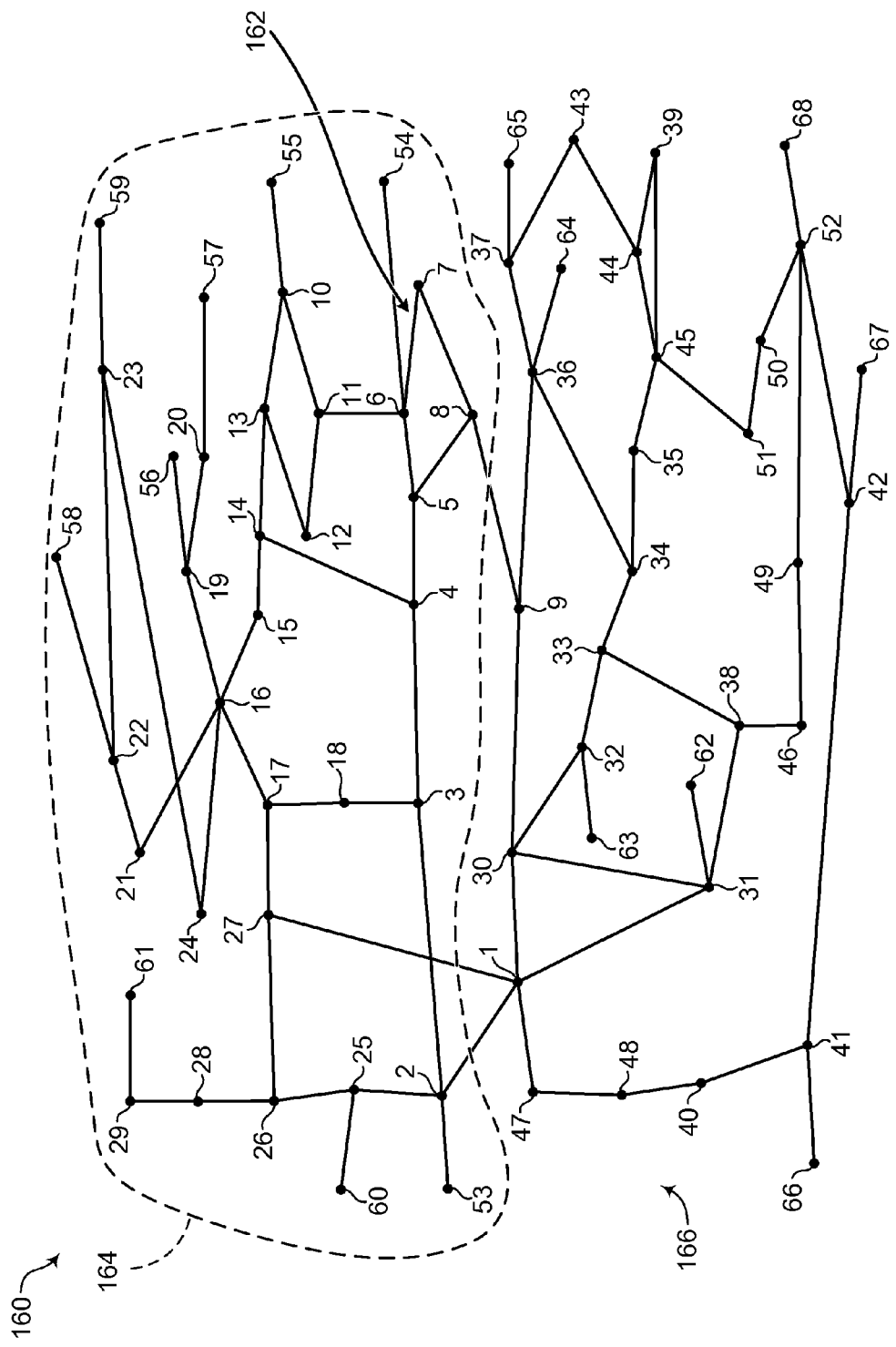

As would be expected, the state estimation solution for the whole network, which is the first iteration, does not converge because of the erroneous measurement placements at branch 6-7, which is indicated at 162. The method 110 would identify the non-convergence and split the network 160 into a predetermined number of areas, as described above. For example, as shown in FIG. 9, after the second iteration, the state estimation for a first area 164 of the network model still does not converge due the presence of the error on branch 6-7. However, the state estimation for the remaining portion of the network model, which may be identified as second area 166, does converge, and second area 166 portion may be excluded. The non-convergent first area 164 identified in FIG. 9 may then be split into two areas, as shown in FIG. 10. After the third iteration, the state estimation for the third area 168 shown in FIG. 10 still does not converge. However, the state estimation for the remaining portion of the network model, which may be identified as the fourth area 170, does converge, and the fourth area 170 may be excluded. After an additional two iterations in this example, as shown in FIGS. 11 and 12, where the third area 168 was split into fifth and sixth areas 172, 174 and the fifth area 172 was split into seventh and eighth areas 176, 178, the algorithm has located the errors in the seventh area 176. As may be seen from FIG. 12, the seventh area 176 is a relatively small part of the network 160 that only includes two branches; namely, branch 6-7 and branch 6-54. At this point, the second part 104 of the method 100 may be executed on the portion of the network model 160 that corresponds to the seventh area 176 to identify the errors in the network model 160.

The results of the above example are also tabulated in FIG. 13, which lists all suspected buses for each iteration. Under the First Iteration, all buses in the network model are suspected because of the bad measurements placed on branch 6-7. At the Second Iteration, the network model has been split into two areas of which only one is non-convergent. Using three further iterations, the error has been located to within 3 nodes (6, 7 and 54), as listed under the Fifth Iteration. The second part 104 of the method 100 may be executed on the portion of the network model corresponding to these three buses to identify the error in the network model as the incorrect branch measurements on the branch 6-7.

Other nonexclusive illustrative examples of errors may include branch parameter errors; branch 1-2 being mistaken as branch 1-3 in the network model such that there is a non-existing branch 1-3 with no measurements, while branch 1-2 is omitted from the network model; flow measurements on one or more branches that are only 50% of the actual value; and erroneous load or generation estimations, such as those that are only 50% of the actual value.

In the second part 104 of the method 100, the suspect portion of the network model that was identified in the first part 102, such as by way of the method 110, is analyzed in more detail to identify the errors in the suspect portion. This analysis may be based on the noticeable measurement residuals in the state estimation solution that would result if state estimation convergence is obtained using the modified state estimation formulation described below.

Figure 14:
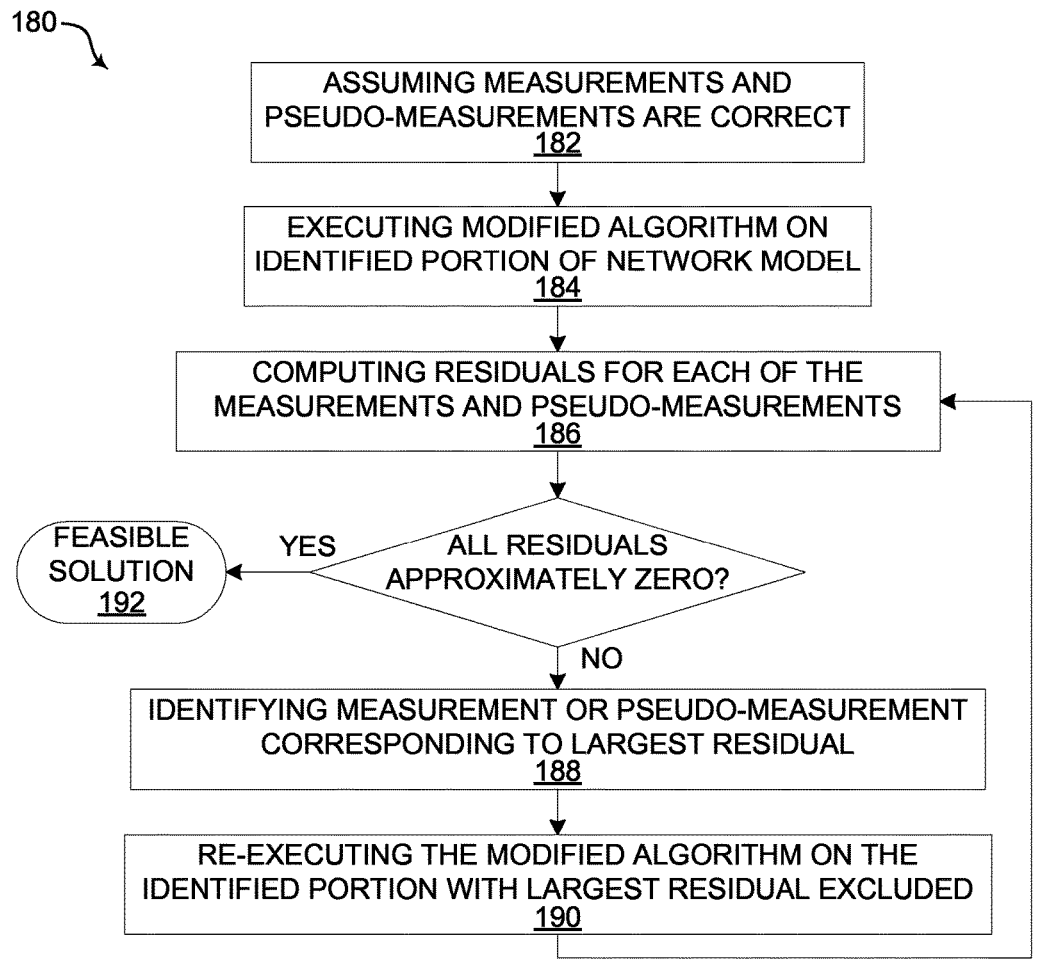
FIG. 14 is a flow chart showing a nonexclusive illustrative example of a method for examining a located portion or portions of a network model to identify plausible data errors therein.

A nonexclusive illustrative example of a process or method for examining an identified or located portion or portions of a network model to identify plausible data errors therein, such as to implement the second part 104 of the method 100, is schematically illustrated in a flow chart at 180 in FIG. 14. Although the actions of the method may be performed in the order in which they are presented below, it is within the scope of this disclosure for the following actions, either alone or in various combinations, to be performed before and/or after any of the other following actions. The illustrated method 180 includes assuming a plurality of measurements and pseudo-measurements are correct, as indicated at 182, executing a modified algorithm on an identified portion of the network model, as indicated at 184, computing residuals for each of the plurality of measurements and pseudo-measurements, as indicated at 186, identifying the one of the plurality of measurements and pseudo-measurements that corresponds to a largest one of the residuals, as indicated at 188, and re-executing the modified algorithm on the identified portion, as indicated at 190. When re-executing the modified algorithm on the identified portion, the one of the plurality of measurements and pseudo-measurements that corresponds to the largest one of the residuals may be excluded from the re-executed modified algorithm. The computing, identifying and re-executing may be repeated until all of the residuals are approximately zero, at which point a feasible solution may be identified, as indicated at 192.

When performing the state estimation on the suspect portion of a network, the classical state estimation formulation set out above in equations (4) to (8) may be modified by augmenting the measurement set (e.g., the active and reactive power injection measurements Pinj, Qinj) to include active and reactive powers (Pflow, Qflow) flowing through the transmission lines as pseudo-measurements. Thus the measurement set becomes:

$$z=[Pinj^T Qinj^T Pflow^T Qflow^T]^T \qquad (9)$$

where the superscript T indicates a transpose.

In a power system state estimation problem, bus voltage angles and magnitudes may usually be considered as state variables, with the state vector being:

$$x=[\theta^T v^T]^T \qquad (10)$$

where θ are the bus voltage angles and v are the bus voltage magnitudes. However, when detecting a dynamic data error that results from incorrect switch statuses, this state vector may be augmented to include the power flows through the switches, with the augmented state vector being required to perform a generalized state estimation. The augmented state vector may be defined as:

$$x=[\theta^T v^T Pflow^T Qflow^T]^T \qquad (11)$$

However, the bus voltage angles and magnitudes may be suppressed from the state vector such that only the powers flowing through the transmission lines are considered as state variables. Thus, the state vector becomes:

$$x=[Pflow^T Qflow^T]^T \qquad (12)$$

Such an approach considerably simplifies the problem formulation and may be adopted for clarity of presentation. However, as will be discussed below, other more general formulations are possible, and it is within the scope of this disclosure to implement the disclosed methods based on more general formulations, such as ones using the complete augmented state vector.

As is known in the art, analysis of only the active part of the problem may be sufficient to identify network topology errors. Furthermore, limiting the analysis to only the active part of the problem may assure that the state estimation converges. Accordingly, only the active power subset of z and x need be considered for analysis. Thus, the measurement set and state vector may be simplified as follows:

$$z=[Pinj^T f^T]^T \qquad (13)$$

$$x=[f] \qquad (14)$$

where f=Pflow. Although the following examples of the second part 104 of the method 100, such as by way of the method 180, are based on consideration of only the active power (DC) sub-problem for simplicity of illustration, it is within the scope of this disclosure for the disclosed method to be implemented based on consideration of the more general problem involving both active and reactive powers.

Figures 15, 16:
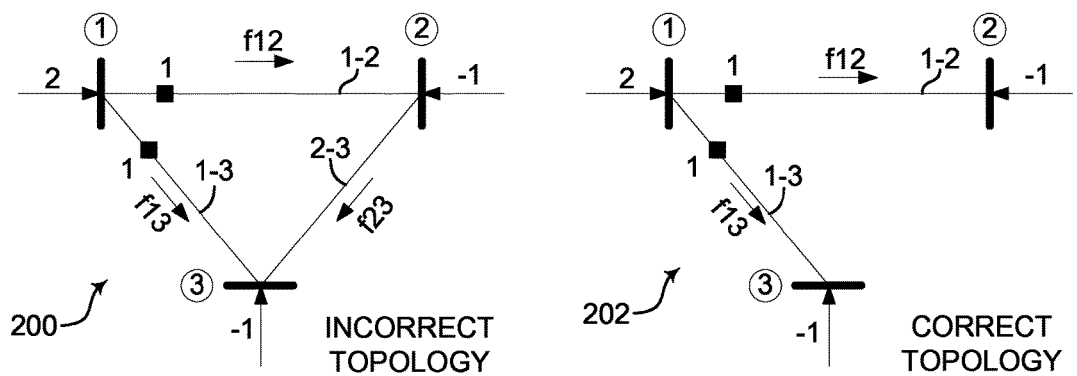
FIG. 15 illustrates a nonexclusive illustrative example of a three-bus network model that was identified for analysis to identify plausible data errors therein, such as due to a non-converging state estimation algorithm.
FIG. 16 illustrates the correct topology for the network model of FIG. 15.

As a nonexclusive illustrative example to illustrate the second part 104 of the method 100 where an identified portion of a network model is examined to identify plausible data errors therein, such as by way of the method 180, consider that the algorithm in the first part 102 of the method 100, such as by way of the method 110, has identified the three-bus network model 200 shown in FIG. 15 for more analysis in the second part 104 of the method 100. Measurements in the network model of FIG. 15 are indicated by black squares on the lines between the nodes or buses. As shown in FIG. 15, line 2-3 is modeled in the EMS database as being in the system network, which is incorrect because line 2-3 is not present in the actual network in the field. In contrast, the network would be correctly modeled by the network model 202 illustrated in FIG. 16, with no line 2-3. The method 180 may be used to identify the incorrect topology assumption shown in FIG. 15 using the available measurements.

In the present example of a three-bus network, there are only three possible line combinations between buses 1, 2 and 3, with the incorrect topology assumption shown in FIG. 15 including all of the possible line connections for the modeled network. The state vector for the network model of FIG. 15 is:

$$x=[f12\ f13\ f23]^T \quad (15)$$

The measurements to be considered during the present example are summarized below in Table 1.

TABLE 1

| Measurement Number | Description | Type |
|---|---|---|
| 1 | P1 = f12 + f13 | Bus injection at bus 1 |
| 2 | P2 = −f12 + f23 | Bus injection at bus 2 |
| 3 | P3 = −f13 − f23 | Bus injection at bus 3 |
| 4 | f12 = 0 | Line 1-2 out pseudo-measurement |
| 5 | f13 = 0 | Line 1-3 out pseudo-measurement |
| 6 | f23 = 0 | Line 2-3 out pseudo-measurement |
| 7 | f12 = 1 | Line flow measurement |
| 8 | f13 = 1 | Line flow measurement |

As indicated in Table 1, measurements 1, 2 and 3 are bus injection measurements, which correspond to the sum of the power flow into and out of respective ones of buses 1, 2 and 3. Measurements 4, 5 and 6 are pseudo-measurements corresponding to a zero-flow condition, which is indicative of a line out (i.e., not present in the actual network) condition for the respective ones of lines 1-2, 1-3 and 2-3. Measurements 7 and 8 are the two line flow measurements indicated by the black squares in FIGS. 12 and 13, which correspond to two of the six possible line flow measurements that could have been considered if such measurements had been available.

Figure 17:
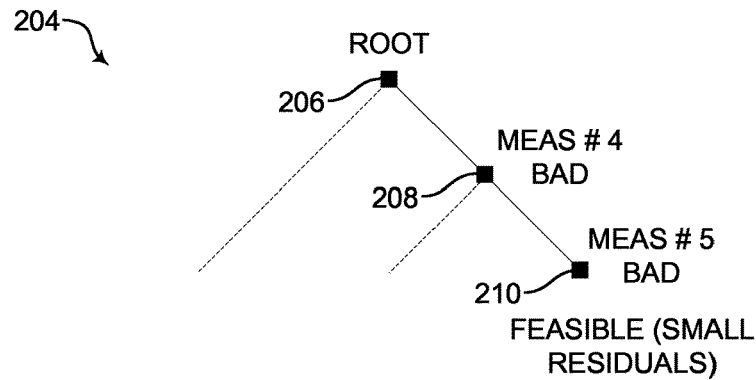
FIG. 17 is a branch and bound optimization tree for the three-bus network model of the example of FIGS. 15 and 16.

Bad measurements and bad pseudo-measurements may be flagged or identified using a normalized residuals-based multiple bad data detection technique. Although a WLS-based state estimation is used during this example, any other standard technique may also or alternatively be used. In the present example, bad data detection is performed using a branch-and-bound binary tree search technique as more fully described below. The tree 204 for this example is illustrated in FIG. 17.

In the branch-and-bound binary tree search technique, analysis starts at a root node where all measurements and pseudo-measurements are considered to be correct. A state estimation, which may be generalized or simplified as described above, is run at the root node and normalized residuals are computed. The technique then advances to the next node, where the state estimation is again executed, albeit with the measurement or pseudo-measurement corresponding to the largest absolute normalized residual, as identified at the prior node, being excluded. The process then repeats, excluding the measurement or pseudo-measurement corresponding to the largest absolute normalized residual, until a node is reached where all of the residuals are small, or approximately zero, at which point the analysis has identified a feasible solution.

For the present example, the branch-and-bound binary tree search starts at the root node 206 where all measurements and pseudo-measurements are considered to be correct. A WLS-based state estimation, which may be generalized or simplified as described above, is run at the root node and normalized residuals are computed. At this point of the example, the largest absolute normalized residual corresponds to measurement 4, which corresponds to line 1-2 being out, so measurement 4 is identified as a bad measurement because line 1-2 should be included in the model.

Next, the method advances to the following node 208, which is labeled as "Meas #4 bad." The WLS-based state estimation, generalized or simplified, is run again with measurement 4 being excluded from the state estimation because it has been identified as a bad measurement. Normalized residuals are again computed, and the largest absolute normalized residual corresponds to measurement 5, which corresponds to line 1-3 being out, so measurement 5 is identified as a bad measurement. The method then advances to the next node 210, which is labeled as "Meas #5 bad" and will have both measurements 4 and 5 excluded from the state estimation. At the "Meas #5 bad" node, the WLS-based state estimation is run with measurements 4 and 5 excluded and the normalized residuals are again computed. At the "Meas #5 bad" node, the normalized residuals are small, exactly zero in this example, so the node 210 is considered as a feasible solution that may correspond to a correct network model.

As pseudo-measurements 4 and 5 respectively correspond to lines 1-2 and 1-3 being considered out or not present in the actual network (shown in FIG. 16), the above algorithm executed by the method indicates that both of these pseudo-measurements, and their underlying assumptions that lines 1-2 and 1-3 are not present in the modeled network, are incorrect. Accordingly, the method indicates that lines 1-2 and 1-3 should be included in the network model, while line 2-3 may need to be omitted from the network model. This result is consistent with the correct topology of the network, which corresponds to the model 202 shown in FIG. 16.

Figures 18, 19:
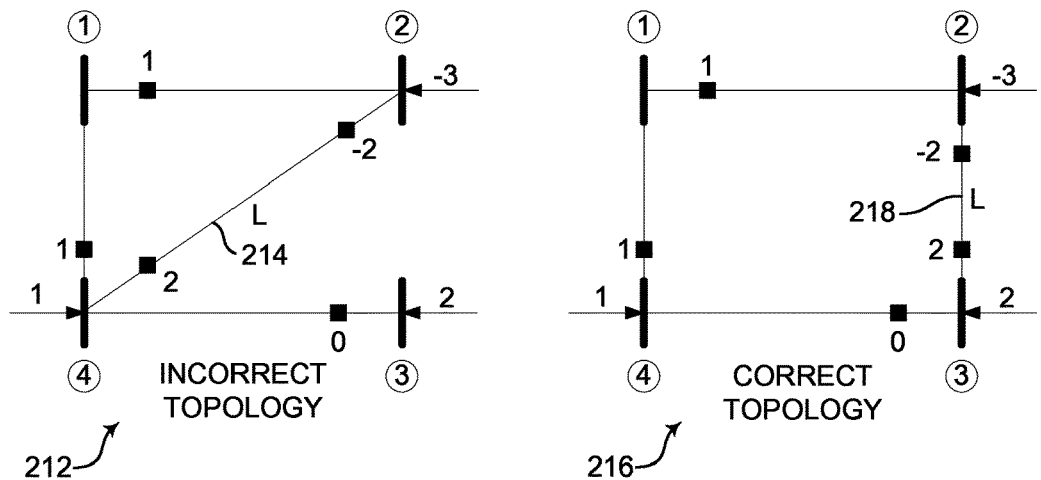
FIG. 18 illustrates a nonexclusive illustrative example of a four-bus network model that was identified for analysis to identify plausible data errors therein, such as due to a non-converging state estimation algorithm.
FIG. 19 illustrates the correct topology for the network model of FIG. 18.

As another nonexclusive illustrative example to illustrate the second part 104 of the method 100 where an identified portion of a network model is examined to identify plausible data errors therein, such as by way of the method 180, consider that algorithm in the first part 102 of the method 100, such as by way of the method 110, has identified the four-bus network model 212 shown in FIG. 18 for more analysis in the second part 104 of the method 100. Measurements in the network model of FIG. 18 are indicated by black squares. As shown in FIG. 18, line "L," which is indicated by 214, is modeled or assumed in the EMS model to be between buses 2 and 4, which is an incorrect topology. In contrast, for the actual network in the field, the correct network model 216 shown in FIG. 19 correctly shows that line "L" lies between buses 2 and 3, as indicated at 218, which represents a correct topology for the real network. The second part 104 of the method 100 may be used to identify the incorrect connection of line "L" shown in FIG. 18 using the available measurements.

Figure 20:
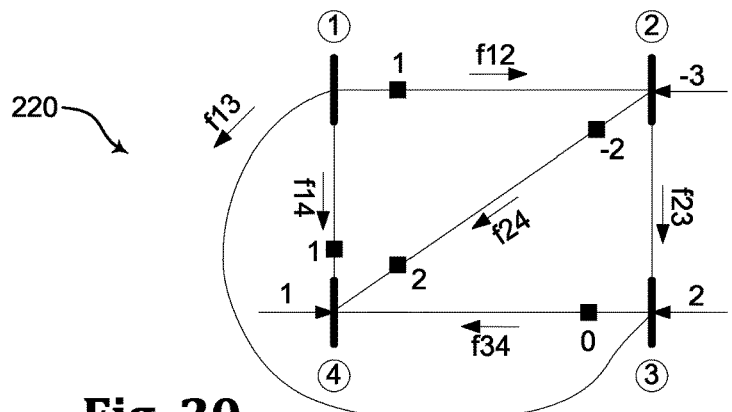
FIG. 20 is a network model of a four-bus system similar to those of FIGS. 18 and 19, showing all possible line connections between the four buses.

By way of example, a system network model for a four-bus system having buses 1 through 4 and all possible line connections between the four buses is shown FIG. 20 at 220. The state vector for the network model of FIG. 20 is:

$$x=[f12\ f13\ f14\ f23\ f24\ f34]^T \quad (16)$$

The measurements to be considered during the present example of the second part 104 of the method 100 are summarized below in Table 2.

TABLE 2

| Measurement Number | Description | Type |
|---|---|---|
| 1 | P1 = f12 + f13 + f14 | Bus injection at bus 1 |
| 2 | P2 = −f12 + f23 + f24 | Bus injection at bus 2 |
| 3 | P3 = −f13 − f23 + f34 | Bus injection at bus 3 |
| 4 | P4 = −f14 − f24 − f34 | Bus injection at bus 4 |

TABLE 2-continued

| Measurement Number | Description | Type |
|---|---|---|
| 5 | f12 = 0 | Line 1-2 out pseudo-measurement |
| 6 | f13 = 0 | Line 1-3 out pseudo-measurement |
| 7 | f14 = 0 | Line 1-4 out pseudo-measurement |
| 8 | f23 = 0 | Line 2-3 out pseudo-measurement |
| 9 | f24 = 0 | Line 2-4 out pseudo-measurement |
| 10 | f34 = 0 | Line 3-4 out pseudo-measurement |
| 11 | f12 = 1 | Line flow measurement |
| 12 | f14 = −1 | Line flow measurement |
| 13 | f24 = −2 | Line flow measurement (at near end, near bus 2) |
| 14 | f24 = −2 | Line flow measurement (at far end, near bus 4) |
| 15 | f34 = 0 | Line flow measurement |

As indicated in Table 2, measurements 1, 2, 3 and 4 are bus injection measurements, which correspond to the sum of the power flow into and out of respective ones of buses 1, 2, 3 and 4. Measurements 5-10 are pseudo-measurements corresponding to a zero-flow condition, which is indicative of a line out (i.e., not present in the actual network) condition for the respective ones of lines 1-2, 1-3, 1-4, 2-3, 2-4 and 3-4. Measurements 11-15 are the five line flow measurements indicated by the black squares in FIGS. 18-20.

Figure 21:
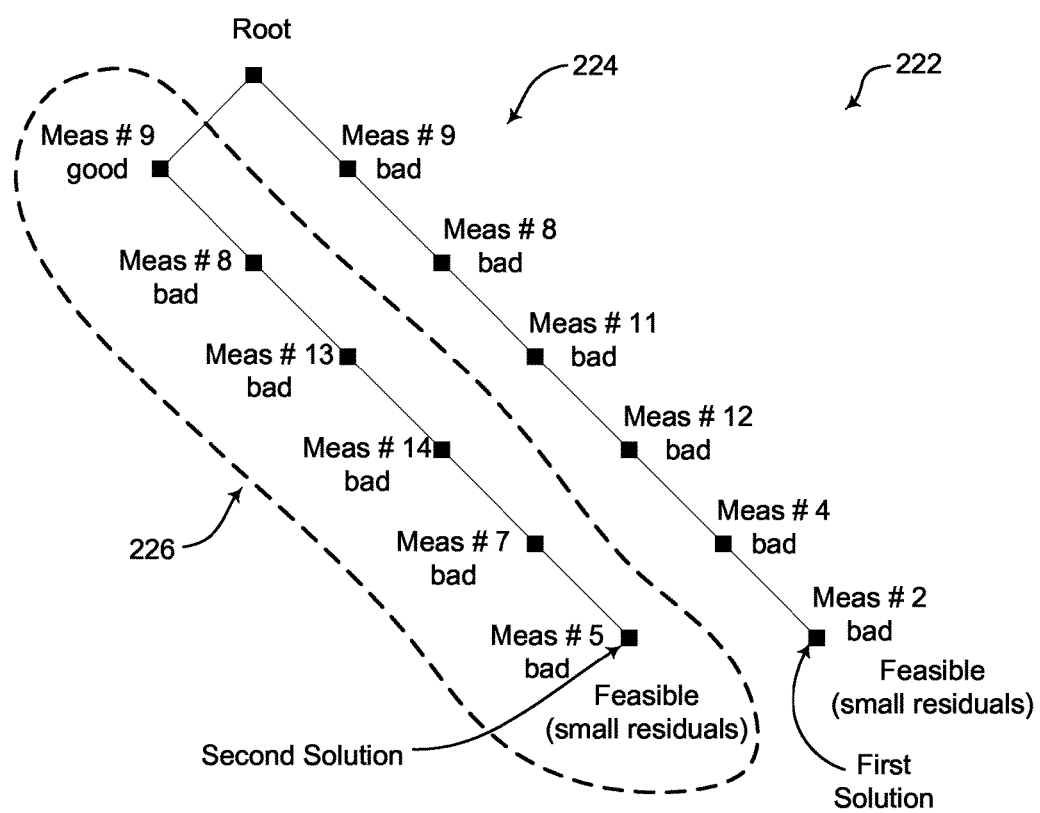
FIG. 21 is a branch and bound optimization tree for the four-bus network model of the example of FIGS. 18 and 19.

Bad measurements and bad pseudo-measurements for the four-bus network model 212 of the present example may be flagged or identified using the normalized residuals based multiple bad data detection technique set out in the previous example for the three-bus network. The tree 222 for the present example is illustrated in FIG. 21. Starting from the root node and successively running state estimations, computing normalized residuals for each state estimation, and excluding the measurement or pseudo-measurement corresponding to the largest absolute normalized residual at each node, the first feasible solution (having small residuals) is obtained when measurements 9, 8, 11, 12, 4 and 2 have been excluded, which corresponds to the branch 224 on the upper right of FIG. 21 ("right branch"). This first solution may serve as an incumbent solution.

Execution of the branch and bound process may continue by returning to the state estimation performed at the root node and considering measurement 9 to be good, and then proceeding down the circled branch 226 on the lower left of FIG. 21 ("left branch") by successively running state estimations, computing normalized residuals for each state estimation, and excluding the measurement or pseudo-measurement corresponding to the largest absolute normalized residual. Another feasible solution may then be obtained when the residuals are small after measurements 8, 13, 14, 7 and 5 have been excluded.

In more detail, the left 226 branch (circled) in FIG. 21 considers measurement 9 to be good, meaning that the line 2-4 out pseudo-measurement is correct, which corresponds to the correct topology of the network model illustrated in FIG. 19, which does not include line 2-4. At the "Meas #8 bad" node, measurement 8, the line 2-3 out pseudo-measurement, is excluded as incorrect, meaning that the network model should include line 2-3, as shown in FIG. 19. At the "Meas #13 bad" node, measurement 13 is excluded meaning that the flow measurement at the near end of line 2-4, as shown in the model in FIG. 18, is incorrect. At the "Meas #14 bad" node, measurement 14 is excluded, meaning that the flow measurement at the far end of line 2-4, as shown in the model in FIG. 18, is incorrect. At the "Meas #7 bad" node, measurement 7, the line 1-4 out pseudo-measurement, is excluded as incorrect, meaning that the network model should include line 1-4, as shown in FIG. 19. At the "Meas #5 bad" node, measurement 5, the line 1-2 out pseudo-measurement, is excluded as incorrect, meaning that the network model should include line 1-2, as shown in FIG. 19.

Figure 22:
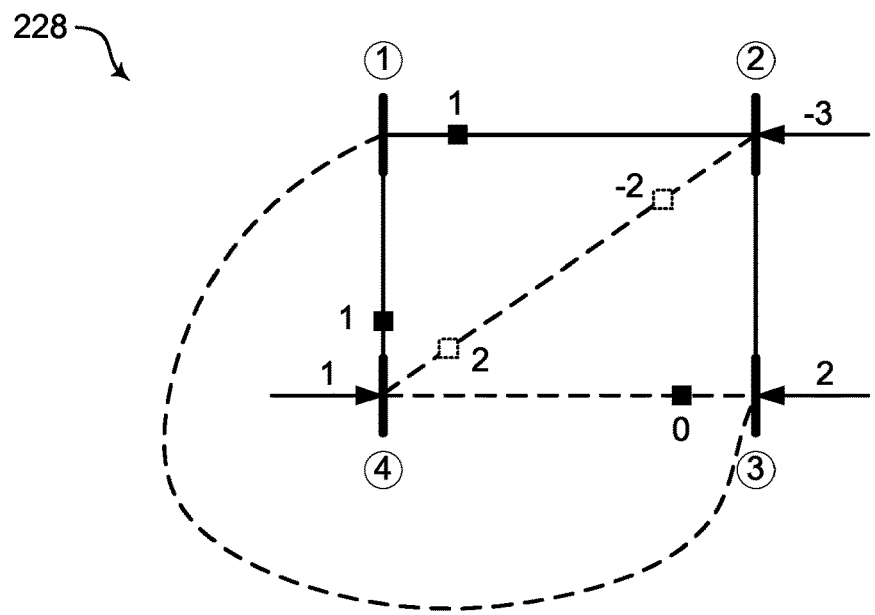
FIG. 22 illustrates a feasible solution for the four-bus network model of the example of FIGS. 18 and 19.

A system network model 228 constructed from the left branch 226, or second solution, is illustrated in FIG. 22. The solid lines in FIG. 22 (lines 1-2, 1-4 and 2-3) should be included in the model, while lines 2-4 and 1-3, which are dashed, and the measurements thereon should be excluded. As may be seen, the network model in FIG. 22 is a relatively close match to the actual network depicted in FIG. 19. However, the zero-value measured flow over the line between buses 3 and 4 (line 3-4) may prevent the method from making a conclusion regarding whether or not line 3-4 should be present. In such a situation, the presence or absence of a line between buses 3 and 4 could be checked manually or using any other suitable analysis technique.

Figure 23:
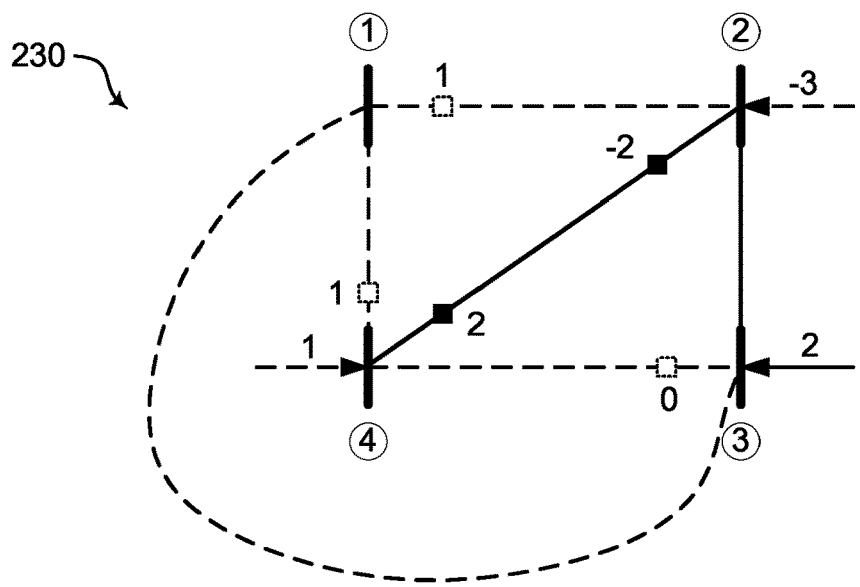
FIG. 23 illustrates another feasible solution for the four-bus network model of the example of FIGS. 18 and 19.

Other feasible solutions can be obtained as the branch and bound process is further continued. For example, it may be useful to analyze the solution provided by the right branch 224 in FIG. 21, where measurements 9, 8, 11, 12, 4 and 2 are excluded to provide the topology of the network model 230 illustrated in FIG. 23. Although it differs from the correct topology shown in FIG. 19, presenting the topology of FIG. 23 to the operator as an additional possible topology (along with other possible topologies in some examples) may be useful because the operator may then choose the possible topology that is best in some practical sense. For example, the operator may be able to use his or her knowledge of the system network to filter out solutions that may be mathematically feasible but are not practically feasible. In particular, the operator may know from other sources the real-time status of a particular transmission line involved in the analysis.

The number of feasible solutions that have plausible explanations and are obtainable through branch-and-bound method may be controlled by tuning of the solution process parameters. The number of branch and bound tree branches to be analyzed is a parameter to be considered when executing the disclosed methods. If the parameter is set too small, the methods may not find the correct topology because not enough branches were analyzed. Analyzing a greater number of branches may obtain a larger number of solutions that may be presented to the operator to assist him or her in reaching a decision. However, analyzing a greater number of branches may naturally involve more computations and/or result in a slower execution of the method. Furthermore, if the parameter is set too high, the analysis may trace the entire branch-and-bound binary tree. Accordingly, the number of branches analyzed should be sufficiently high as to provide a reasonable assurance of finding the correct topology without being set so high that the execution is too slow for efficient use. For example, when the methods are used in a real-time application, limitations of available computing power may provide an upper limit on the number of branches that may be analyzed. Absent further guidance, the number of branches analyzed may be set as a function of the number of measurements in the particular network model being analyzed or to an arbitrary number such as 1, 2, 3, 4, 5 or 6 branches.

Although the above examples illustrate particular implementations of the disclosed methods, more generalized formulations of the various algorithms of the disclosed methods are within the scope of the present disclosure. For example, another parameter that may be considered in implementations of the disclosed methods is a weight that may be assigned to the line-out pseudo-measurements. A larger value of the weight would tend to emphasize static topology errors and detect incorrect line assumptions. For example, with a larger value of the weight, the method would more likely detect incorrect line-out assumption as opposed to incorrect injections at the line's two ends. However, a larger weight may increase the possibility of false positives for topology errors. Accordingly, the weight should be tuned carefully based on knowledge of the particular system network and/or the operator's experience.

In some examples, the algorithms used in the branch-and-bound search may be generalized to identify both measurement and static topology assumption errors, even where the measurements and static topology assumptions are simultaneously in error. Such a generalization may additionally or alternatively capture other cases of static errors such as incorrect measurement placement assumptions or the type or sign of the measurement being incorrect, all of which would result in the concerned measurement(s) being incorrect.

More generalized formulations of the disclosed methods that are within the scope of the present disclosure may identify incorrect line parameter values. In particular, the identification of static topology errors, such as erroneous inclusion or exclusion of lines (line-in or line-out errors) is made based on incorrect assumptions regarding line power flows. However, the incorrect line power flows could be a result of either the associated incorrect measurements or incorrect line parameter values from which the line flow measurements or pseudo-measurements have been derived. As would be expected, line parameter value accuracy contributes to the accuracy of static topology error identification, as well as the identification of other types of static data errors. Thus, a more generalized implementation of the disclosed methods that simultaneously detects both static data errors and line parameter errors may enhance the detection accuracy of static topology errors as well as of other types of static data errors.

Further, although consideration of only line-out pseudo-measurements may be sufficient to provide a good estimate of the correct topology, it is within the scope of this disclosure that some examples of the disclosed methods include simultaneous consideration of both line-in and line-out pseudo-measurements. In some examples, the disclosed methods may perform a more generalized state estimation where the state vector includes the bus angles and/or the bus voltages in addition to the line flows. In some examples, the algorithms of the methods may be formulated to include virtual switches in series with transmission lines, with the flows through the virtual switches being included in the state vector. In such examples, the in and out pseudo-measurements for the switches may be considered simultaneously.

As may be understood from the above-description, the disclosed methods may be used to identify various types of errors, such as topology, measurement or parameter errors. Furthermore, the disclosed methods, which may be unaffected by problems related to divergence or non-convergence of the state estimation, may be used in pre-processing contexts for a state estimation.

The disclosed methods may be implemented into an EMS or DMS and/or may be performed by a computer that includes a processor that executes a set of corresponding instructions, which may be stored on a computer-readable storage medium, such as to systematically and/or automatically detect and/or identify topology and/or measurement errors that might be associated with a power system state estimation or the underlying model of the power system network. In some examples, the methods may form a pre-processing event that is associated with the power system state estimation.

The computer-readable medium may be any medium that can contain, store, communicate, propagate, or transport the program instruction for use by or in connection with the instruction execution system, apparatus, or device and may, by way of example but without limitation, be an electronic, magnetic, optical, electromagnetic, infrared, or semiconductor system, apparatus, device, or propagation medium or other suitable medium upon which the program is recorded. More specific examples (a non-exhaustive list) of such a computer-readable medium may include: a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Computer program code or instructions for carrying out operations of the disclosed methods and systems may be written in any suitable programming language provided it allows achieving the previously described technical results. The instructions may be configured for execution on any device having sufficient processing power.

When executed, the methods can aid a power system operator by predicting or identifying bad static topology assumptions and/or static topology errors in an EMS network model, such as those errors that are due to incorrectly modeled transmission line connections and/or incorrectly modeled measurement placement, sign or type. In particular, the methods may systematically and/or automatically provide the operator with the locations of the static or other errors in the network model such that appropriate corrective action can be taken. In some examples, subsequent corrections to the model can be done automatically without further human interference, or the operator can further inspect the results and make a decision based on other practical considerations/feasibilities.

It is believed that the disclosure set forth herein encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the disclosure includes all novel and non-obvious combinations and subcombinations of the various elements, features, functions and/or properties disclosed herein. Similarly, recitation in the disclosure and/or the claims of "a" or "a first" element, or the equivalent thereof, should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower or equal in scope to the original claims, are also regarded as included within the subject matter of the inventions of the present disclosure.

What is claimed is:

1. A method for detecting state estimation network model data errors, the method comprising:
performing, with a computer processor, the following steps:
splitting a state estimation network model of a power system into a first plurality of portions of the power system;
executing a state estimation algorithm on each of the portions;
identifying a portion of the power system for which the state estimation algorithm is determined to be non-converged;
splitting the identified portion into a second plurality of portions of the power system;
repeating the executing, identifying and splitting the identified portion until a resulting identified portion of the power system is smaller than a predefined threshold;
examining the resulting identified portion to identify plausible data errors therein, wherein the state estimation network model data errors are static data errors that comprise at least one static topology error, wherein the at least one static topology error is directed to components of the power system that do not change during operation of the power system including one or more incorrectly modeled transmission line connection locations, wherein the at least one static topology error is identified to an operator of the power system as an erroneous assumption in the state estimation network model regarding the presence or absence of a transmission line between two buses of the power system, wherein examining the resulting identified portion to identify plausible static data errors therein includes executing a modified state estimation algorithm on the resulting identified portion in which an augmented measurement set comprises a plurality of power flow pseudo-measurements that each correspond to a zero flow condition between a corresponding pair of buses to model the transmission line being absent between every one of a plurality of pairs of buses in the identified portion; and
correcting the state estimation network model in response to the location of the at least one static topology error.

2. The method of claim 1, wherein the state estimation network model data errors further comprise at least one measurement error in addition to the static data errors.

3. The method of claim 1, wherein at least one of splitting the state estimation network model and splitting the identified portion are performed using a spectral factorization method.

4. The method of claim 1, wherein at least one of splitting the state estimation network model and splitting the identified portion minimizes a number of connections between the respective first and second pluralities of portions.

5. The method of claim 1, wherein examining the resulting identified portion comprises:
assuming a plurality of measurements and pseudo-measurements are correct;
computing residuals for each of the plurality of measurements and pseudo-measurements;
identifying one of the plurality of measurements and pseudo-measurements as corresponding to a largest one of the residuals;
re-executing the modified state estimation algorithm on the resulting identified portion, wherein the one of the plurality of measurements and pseudo-measurements corresponding to the largest one of the residuals is excluded from the re-executed state estimation modified algorithm; and
repeating the computing, identifying and re-executing until the residuals are approximately zero.

6. A method for detecting state estimation network model static data errors, the method comprising:
performing, with a computer processor, the following steps:
locating a portion of a state estimation network model of a power system for which a state estimation algorithm does not converge;
executing a modified state estimation algorithm on the portion to identify plausible static data errors therein, wherein the modified state estimation algorithm includes an augmented measurement set of the power system and the plausible static data errors include at least one static topology error, wherein the at least one static topology error is directed to components of the power system that do not change during operation of the power system including one or more incorrectly modeled transmission line connection locations, wherein the at least one static topology error is identified to an operator of the power system as an erroneous assumption in the state estimation network model regarding the presence or absence of a transmission line between two buses of the power system, wherein the augmented measurement set comprises a plurality of power flow pseudo-measurements each corresponding to a zero flow condition between two buses of the portion to model the transmission line being absent from between every one of a plurality of pairs of buses in the portion of the state estimation network model; and
correcting the state estimation network model in response to the location of the at least one static topology error.

7. The method of claim 6, wherein each of the plurality of power flow pseudo-measurements comprises at least one of an active power and a reactive power flowing through the transmission line.

8. The method of claim 7, wherein the modified state estimation algorithm excludes reactive power measurements.

9. The method of claim 8, wherein the modified state estimation algorithm considers only active power measurements.

10. The method of claim 6, wherein the plausible static data errors are identified through a normalized residuals-based multiple bad data detection technique.

11. The method of claim 10, wherein the normalized residuals-based multiple bad data detection technique comprises performing a branch-and-bound binary tree search.

12. The method of claim 10, wherein the normalized residuals-based multiple bad data detection technique comprises:
assuming measurements and pseudo-measurements are correct;
executing the modified state estimation algorithm on the portion;
computing normalized residuals for each of the measurements and pseudo-measurements;
identifying one of the measurements and pseudo-measurements as corresponding to a largest absolute normalized residual; and re-executing the modified state estimation algorithm on the portion, wherein the one of the measurements and pseudo-measurements corresponding to the largest absolute normalized residual is excluded from the re-executed modified state estimation algorithm.

13. The method of claim 12, comprising repeating the computing, identifying and re-executing until the normalized residuals are approximately zero.

14. The method of claim 12, wherein locating a portion of the state estimation network model for which a state estimation algorithm does not converge comprises:
   splitting the state estimation network model into a plurality of portions;
   executing the state estimation algorithm on each of the plurality of portions; and
   identifying one of the plurality of portions for which the state estimation algorithm is determined to be non-converged.

15. A method for detecting static data errors in a power system state estimation network model, the method comprising:
   performing, with a computer processor, the following steps:
   splitting the state estimation network model of a power system into a first plurality of partitions of the power system;
   executing a state estimation algorithm on each of the of partitions;
   identifying a partition of the power system for which the state estimation algorithm does not converge;
   splitting the identified partition into a second plurality of partitions of the power system;
   repeating the executing, identifying and splitting the identified partition until a resulting identified partition of the power system is smaller than a predefined number of nodes of the power system;
   examining the resulting identified partition to identify plausible static data errors therein, wherein the plausible static data errors include at least one static topology error, wherein the at least one static topology error is directed to components of the power system that do not change during operation of the power system including one or more incorrectly modeled transmission line connection locations, wherein the at least one static topology error is identified to an operator of the power system as an erroneous assumption in the state estimation network model regarding the presence or absence of a transmission line between two buses of the power system, wherein examining the resulting identified partition to identify plausible static data errors therein includes executing a modified state estimation algorithm on the resulting identified partition in which an augmented measurement set comprises a plurality of power flow pseudo-measurements that each correspond to a zero flow condition between a corresponding pair of buses to model the transmission line being absent between every one of a plurality of pairs of buses in the identified partition; and
   correcting the state estimation network model in response to the location of the at least one static topology error.

16. The method of claim 15, wherein the state estimation algorithm comprises an iterative weighted-least squares method.

17. The method of claim 15, wherein the state estimation algorithm considers a plurality of measurements comprising real and reactive power measurements.

18. The method of claim 17, wherein examining the resulting identified partition to identify static data errors therein comprises:
   executing the modified state estimation algorithm to include an active power flow pseudo-measurement for at least one transmission line, and the modified state estimation algorithm excludes reactive power measurements; and
   executing a normalized residuals-based multiple bad data detection technique.

19. The method of claim 18, wherein the normalized residuals-based multiple bad data detection technique comprises:
   assuming all measurements and pseudo-measurements for the resulting identified partition are correct;
   executing the modified state estimation algorithm on the resulting identified partition;
   computing normalized residuals for each of the measurements and pseudo-measurements;
   identifying one of the measurements and pseudo-measurements as corresponding to a largest absolute normalized residual;
   re-executing the modified state estimation algorithm on the resulting identified partition, wherein the one of the measurements and pseudo-measurements corresponding to the largest absolute normalized residual is excluded from the re-executed modified state estimation algorithm; and
   repeating the computing, identifying and re-executing until the normalized residuals are approximately zero.

* * * * *